United States Patent [19]

Missel

[11] 3,791,028

[45] Feb. 12, 1974

[54] ULTRASONIC BONDING OF CUBIC CRYSTAL-STRUCTURE METALS

[75] Inventor: Leo Missel, Palo Alto, Calif.

[73] Assignee: International Business Machines Corporation, Armonk, N.Y.

[22] Filed: Sept. 17, 1971

[21] Appl. No.: 181,502

[52] U.S. Cl. .................... 29/628, 29/470.1, 29/504, 228/1

[51] Int. Cl. .................... H01r 43/00, H05k

[58] Field of Search ... 29/470.1, 628, 504; 317/234; 228/1

[56] References Cited

UNITED STATES PATENTS

| | | | |
|---|---|---|---|
| 2,946,119 | 7/1960 | Jones et al. | 29/470.1 X |
| 3,458,921 | 8/1969 | Christensen | 29/470.1 |
| 3,593,412 | 7/1971 | Foote | 29/589 |
| 3,609,472 | 9/1971 | Bailey | 317/234 R |
| 3,617,818 | 11/1971 | Fuller | 317/234 R |
| 3,662,454 | 5/1972 | Miller | 29/470.1 |

FOREIGN PATENTS OR APPLICATIONS

| | | | |
|---|---|---|---|
| 845,112 | 8/1960 | Great Britain | 29/470.1 |
| 211,998 | 8/1955 | Australia | 29/470.1 |

OTHER PUBLICATIONS

J. J. Cuomo, "A Molybdenum to Copper Bond Utilizing Thermal Compression Gold Bonding," IBM Technical Disclosure Bulletin, Vol. 7, No. 3, 8/64.

Potthoff et al., "Ultrasonic Welding of Dissimilar-Metal Combinations," Welding Journal, Feb., 1960.

*Primary Examiner*—J. Spencer Overholser
*Assistant Examiner*—Ronald J. Shore
*Attorney, Agent, or Firm*—Maurice H. Klitzman; Melvyn D. Silver

[57] ABSTRACT

Improved corrosion resistant, high ductility ultrasonic bonds are formed between two cubic structure metallic members such as a copper wire and a copper clad printed circuit board. Each of the members is coated, preferably by plating with a smooth layer of dead soft gold prior to bonding. The coated members are then ultrasonically bonded together. The bond formed is preferably a gold-to-gold joint with no contact between the cubic structure metallic members. This bond is unexpectedly much stronger than the dead soft gold of which it is comprised. Preferred plating and bonding parameters are discussed and analyzed.

6 Claims, 13 Drawing Figures

Patented Feb. 12, 1974

3,791,028

7 Sheets-Sheet 1

INVENTOR.
LEO MISSEL

BY Maurice H. Klitzman
ATTORNEY

| Copper Thickness on Board (mils) | 74 | | | | | |
|---|---|---|---|---|---|---|
| Wire Diameter (mils) | 2.5 | | 3.5 | | 4.0 | |
| Tensile Strength of Wire (gms) | 93 | | 183 | | 225 | |
| Bonding Time (Secs) | .57 | 2.8 | .57 | 2.8 | .57 | 2.8 |
| Power Inputs - 81 | 100% | 100% | 85% | 90% | 63% | 95% |
| 91 | 100% | 100% | 90% | 86% | 94% | 96% |
| 100 | 100% | 100% | 90% | 90% | 100% | 86% |
| 106 | 100% | 100% | 90% | 85% | 99% | 83% |
| 112 | 100% | 100% | 88% | 76% | 86% | Failed |
| Copper Thickness on Board (mils) | 98 | | | | | |
| Wire Diameter (mils) | 2.5 | | 3.5 | | 4.0 | |
| Tensile Strength of Wire (gms) | 93 | | 183 | | 225 | |
| Bonding Time (secs) | .57 | 2.8 | .57 | 2.8 | .57 | 2.8 |
| Power Inputs 81 | 100% | 98% | 81% | 88% | 94% | 99% |
| 91 | 100% | 98% | 87% | 84% | 85% | 99% |
| 100 | 100% | 98% | 88% | 90% | 85% | 90% |
| 106 | 100% | 98% | 88% | 80% | 96% | 95% |
| 112 | 100% | 98% | 89% | 78% | 88% | 76% |
| Thickness on Board (mils) | 124 | | | | | |
| Wire Diameter (mils) | 2.5 | | 3.5 | | 4.0 | |
| Tensile Strength of Wire (gms) | 93 | | 183 | | 225 | |
| Bonding Time (secs) | .57 | 2.8 | .57 | 2.8 | .57 | 2.8 |
| Power Inputs 81 | 100% | 100% | 90% | 88% | 63% | 95% |
| 91 | 90% | 100% | 88% | 88% | 94% | 96% |
| 100 | 100% | 100% | 88% | 78% | 100% | 86% |
| 106 | 100% | 86% | 87% | 72% | 99% | 83% |
| 112 | 100% | 90% | 88% | Failed | 86% | Failed |

FIG. 6

ULTRASONIC BONDING OF CUBIC CRYSTAL-STRUCTURE METALS

BACKGROUND OF THE INVENTION

1. Field of the Invention

The invention relates to the field of ultrasonic bonding of cubic crystal-structure and more particularly to the field of ultrasonic bonding interconnecting wires to printed circuit boards.

2. State of the Prior Art

Ultrasonic bonding of interconnecting wires in printed circuit application has been an attractive goal because of its desirable potential for eliminating soldering and the resultant thermal exposure of delicate components mounted on the circuit board. Additionally, ultrasonic bonding offers the potential of much denser placement of wires and the prevention of displacement of wires prior to bonding as can occur when many wires are placed and then simultaneously soldered. Despite the desirability of the goal, the prior art has been unsuccessful in meeting it.

There have been attempts to ultrasonically bond solid gold wire to nickel-chromium-nickel layers on a substrate. However, such bonds are of restricted usefulness because the low mechanical strength and cold workability of the gold wire leads to embrittlement of the wire at the joint, thus reducing the strength of the wire and producing a poor bond. The relatively low conductivity of gold is a further disadvantage of this method.

Solid aluminum wire has been successful ultrasonically bonded to aluminum pads and to gold plated aluminum pads for use in attaching micro circuits to headers on which they are mounted for encapsulation. However, because the solid aluminum wires are relatively weak mechanically the wires must be enclosed in a protective enclosure to prevent breakage. This process is not suitable for bonding copper wires to copper clad circuit boards because the addition of aluminum pads to the copper layers on the circuit boards creates reliability problems since the copper-aluminum boundary is subject to electro erosion. Also it has been considered impractical to bond copper wire to gold plated copper pads.

The prior art has been unsuccessful in obtaining satisfactory strong ultrasonic bonds between copper wire and copper clad printed boards. An additional problem is that the exposed copper, especially fine wires, will corrode.

Even though the previously mentioned ultrasonic bonding of gold wire to nickel-chromium-nickel layers has had limited success, it remains a laboratory process because tight control of bonding parameters is necessary to achieve its limited success. Such tight control of the parameters is not feasible in a manufacturing environment if consistently good results are to be obtained.

OBJECTS OF THE INVENTION

A primary object of the invention is to ultrasonically bond copper to copper.

Another object of the present invention is to ultrasonically bond fine copper wire to copper clad printed circuit boards.

Still another object of the invention is to create corrosion resistant ultrasonic bonds of copper interconnecting wires to copper clad circuit boards.

A further object of the invention is to ultrasonically bond interconnecting wires to copper clad circuit boards in a manner which allows their subsequent removal and reattachment.

A still further object is to bond dissimilar cubic structure materials without creating a danger of electro erosion.

SUMMARY OF THE INVENTION

The above and other objects and advantages are obtained by plating two cubic structure materials which are to be bonded together with smooth layers of dead-soft gold and then ultrasonically bonding the two members together. For proper bonding, the gold layers must be dead-soft and must have no macro structure. The members are thoroughly cleaned prior to plating to assure the production of adherent, structureless, dead-soft, gold layers. A plating current of from 2 to 6 amperes per square foot of the area to be plated is preferred for the plating solutions used, with areas such as printed circuit boards, where the agitation of the plating solution may be ineffective to assure the constant availability of sufficient gold to support a higher plating rate. For those areas, such as fine wires, where the effectiveness of the agitation can be more easily assured, a plating current of between 2 and 15 amperes per square foot of area to be plated is preferred for the plating solutions used. With the use of other baths or through the use of special agitation techniques, higher plating currents may be used for both the wires and the board.

The ultrasonic bonding is preferably performed with a low clamping force, a relatively low power and a short duration bonding cycle to prevent damage to the articles being bonded. Bonds formed in accordance with this invention are unexpectedly much stronger than the dead-soft gold of which they are formed.

The present invention provides a feasible method of bonding copper interconnecting wires to copper clad circuit boards in manufacturing production by providing a wide range of bonding parameters which yield consistently reliable bonds. The clamping force holding the work pieces together during ultrasonic bonding can be consistently repeated in a production process, as can the amplitude of the ultrasonic vibration imparted to the bonding tip and the duration of the application of the bonding vibration. Because good bonds are obtained with a wide range of bonding parameters, normal manufacturing parameter-control yields consistently reliable bonds.

The ultrasonic bond formed by the process of this invention is a gold-to-gold bond which prevents chemical or electrochemical interaction of the bonded members. Thus the gold coatings and the gold-to-gold bond provide complete environmental protection for the bonded members.

Another feature of the invention which lends itself to a manufacturing process is that the copper wires attached by this process, although of small diameter (2.5 –4.0 mils), possess sufficient strength to be left unencapsulated. Because the wires are exposed, they may be readily removed and reattached at the same location. This reworkability allows for replacement of wires which are inadvertantly broken or which must be relocated because of engineering changes either in production or in the field. This reworkability is of vital importance since it enables very expensive units to be repaired rather than junked. Additionally, the repair process does not adversely affect the quality or reliability of the repaired device.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIG. 6 is a table of bond pull strength data and parameter ranges yielding good bonds.

DETAILED DESCRIPTION OF THE INVENTION

Figure 1:
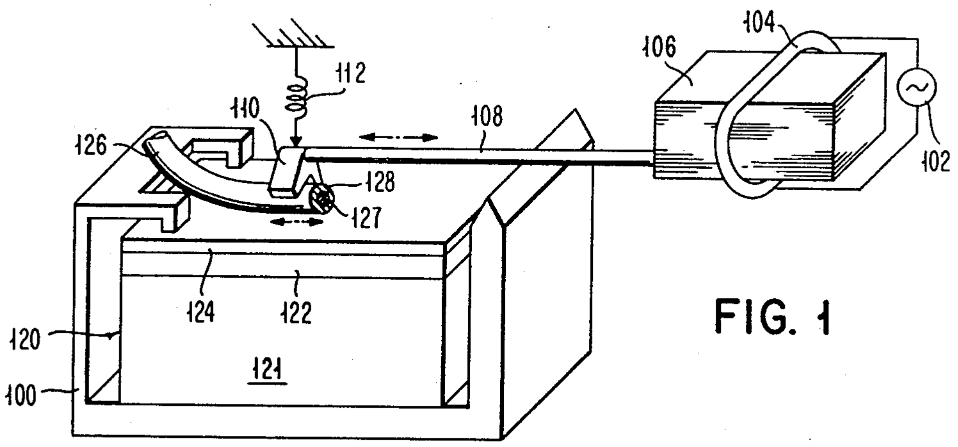
FIG. 1 is a schematic illustration of an ultrasonic bonding apparatus.

Ultrasonic bonding apparatus are well known in the art. Any ultrasonic bonding apparatus appropriate to the size of the work pieces may be used in carrying out the method of this invention. A typical ultrasonic bonding apparatus is shown in idealized form in FIG. 1. Briefly, the apparatus consists of a work holder 100 for holding a stationary work piece 120 and vibration means for ultrasonically vibrating a moving work piece 126. The work holder 100 may include means for clamping the stationary work piece. The vibration means consists of an excitation oscillator 102, an excitation coil 104, a magneto strictive transducer 106, a half wave drive rod 108 and a bonding tip 110. The frequency of the excitation oscillator 102 determines the vibration frequency by driving excitation coil 104. The varying magnetic field developed by the coil establishes a standing mechanical wave in the magnetostrictive transducer 106. Drive rod 108 transmits the vibration to bonding tip 110 which drives the moving work piece 126, which is shown as a wire being oscillated back and forth longitudinally. A clamping force is supplied by a spring 112 pressing on drive rod 108 near tip 110. This clamping force holds the moving work piece 126 in contact with the stationary work piece 120 with a predetermined force. Stationary work piece 120 is shown in FIG. 1 as a copper clad laminated fiber glass circuit board consisting of fiber glass body 121 having a copper layer 122 thereon. According to the invention, the copper layer 122 is plated with a layer 124 of smooth, dead-soft gold. The moving work piece 126 is shown as a piece of copper wire which according to the invention is plated with a layer 128 of smooth dead-soft gold. The frequency of oscillation of the excitation oscillator 102 is preferably about 60,000 Hz and the amplitude is made variable to allow the amount of power applied to moving work piece 126 through bonding tip 110 to be controlled.

OPERATION

Briefly, two cubic structure members to be bonded together are each coated with a layer of smooth dead-soft gold, held in contact with each other and ultrasonically vibrated to create a gold-to-gold bond securing the two members together. For purposes of the disclosure, dead-soft gold is gold with a knoop hardness between 50 and 100 and better than 99.98 percent pure.

This invention is of general utility throughout the ultrasonic bonding field. However, in explaining the operation of the invention, an illustration of attaching (2.0–4.5 mil diameter) copper wires to copper clad printed circuit boards is used. This illustrative embodiment is only one of a vast number of problems which the present invention solves and is not to be considered as limiting the applicability of the process, or the scope of the claims.

Figure 2:
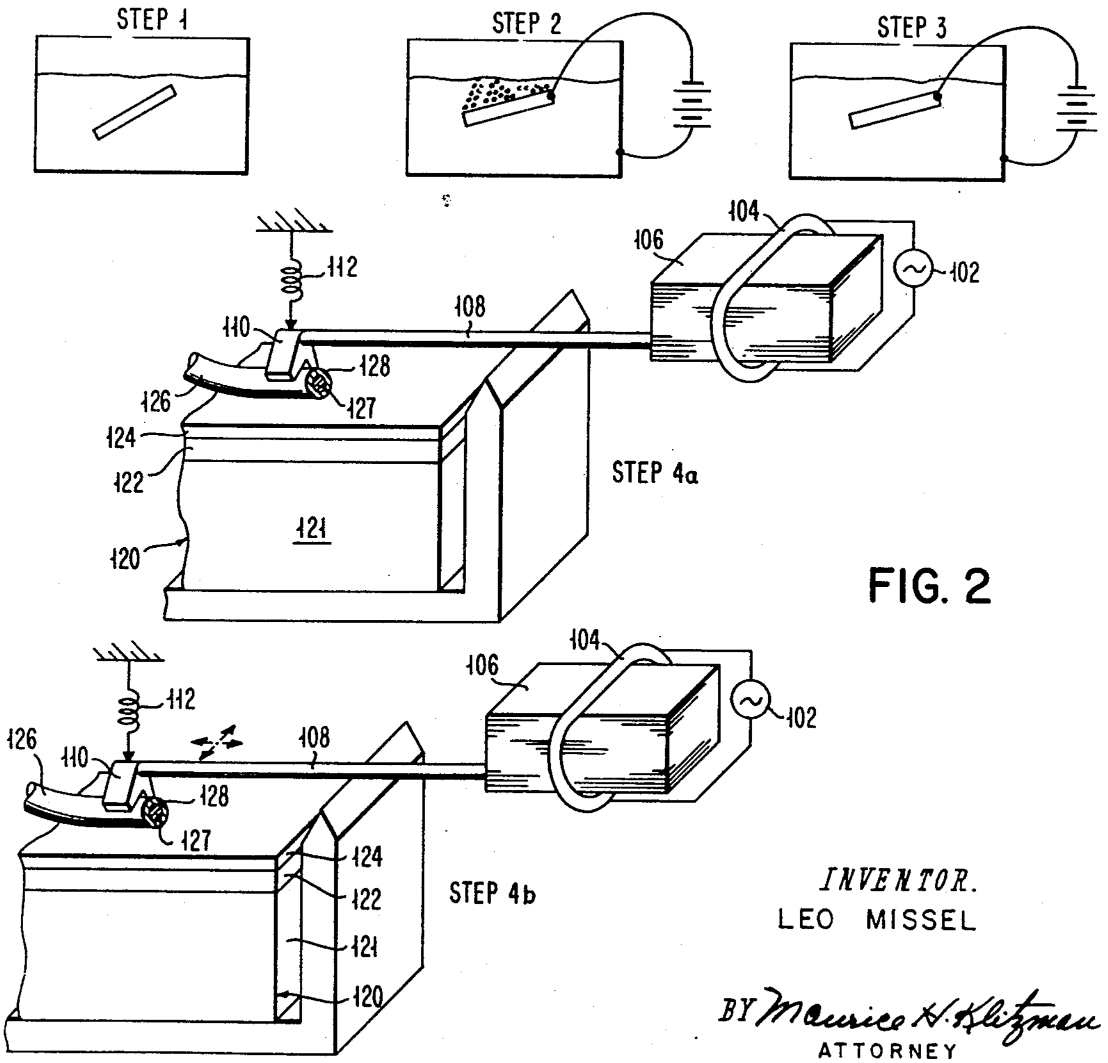
FIG. 2 illustrates the method of the present invention in block form.

FIG. 2 illustrates the main steps in the bonding process. These steps will be outlined here and discussed in more detail hereinafter. The first step in the method is to clean both members which are to be bonded prior to application of a gold coating by any suitable method, such as plating. Second, a thin strike coating of gold is electro-plated onto each member to be bonded to coat the members with a highly adherent gold layer which will prevent acid attack during the subsequent accumulation of a thick layer of gold. Third, a thicker accumulation layer of gold is plated onto both members at a current density which yields a smooth, dead-soft layer of gold. After the gold plating has been completed, the members are dried, and then placed in contact with each other. Thereafter, an ultrasonic bonding tip is positioned on one member and a clamping force is applied if needed. Finally, the bonding tip vibrates the member with which it is in contact ultrasonically until a bond is formed between the gold layers.

To successfully ultrasonically bond the members together the gold must adhere strongly to each member and must not be contaminated by the members on which it is plated. Therefore, as illustrated in FIG. 2, step 1, the first step of the plating process is to thoroughly clean each member to assure the strong adhesion necessary for strong bonds. Any cleaning process which thoroughly cleans the surface in preparation for plating is acceptable. Good quality adhesion between the gold plating and a copper clad printed board is obtained if the board is cleaned with an abrasive cleaner containing wetting and sequestering agents and a fine abrasive (such as pumice) which will not scratch the copper surface. The abrasive is removed from the boards by wiping during rinsing. Following the removal of the abrasive, the board is immersed for thirty seconds in a 20 percent ammonium persulfate solution to activate the copper surface for better adhesion of the subsequently deposited gold. The bulk of the ammonium persulfate is removed by water rinsing, however, since it is difficult to remove all of the ammonium persulfate by water rinsing, the water rinse is followed by a one-minute immersion in 3 percent sulfuric acid to help to loosen the remaining ammonium persulfate. Following the sulfuric acid immersion, the cleaning step is completed by a distilled water rinse to remove all contamination from the board.

The operations in cleaning the wire differ from those of the board because of the diameter (2.5–4.0 mils) of the wire as well as the fact that the wire is initially much cleaner than the boards. It is generally not necessary to use an abrasive cleaner on the wire since it does not contain the gross contaminates that might be found on the boards and also such a cleaner will remove an excessive amount of copper from the small diameter wire. The wire is cleaned by dipping it in a solution of thiourea and acid to remove any tarnish, dielubricant or other contaminating materials from the wire. The wire is then rinsed and dipped in fluoboric acid ($HBF_4$). The fluoboric acid is used in cleaning the wire because unlike ammonium persulfate it does not dissolve copper. After the fluoboric acid dip, the cleaning step is completed by rinsing the wire with tap water and then distilled water.

The second step of bonding process is to apply a gold strike coating to each member. This coating is preferably applied in a plating bath at 130° F into which the board is immersed for thirty seconds with a current density of between 15 and 25 amperes per square foot (ASF) of plating area. The cathode is attached to the copper and energized prior to immersion in the strike bath to assure that plating starts immediately as the members enter the bath and to prevent detrimental chemical reactions which may take place in the absence of the plating voltage. The wire is strike plated in the same fashion as a board, but for only 20 seconds because of the more efficient coating resulting from the wire's geometry. The strike coating step is completed by rinsing the member in distilled water to prevent contamination of the accumulation plating bath by the strike bath. The strike bath is inefficient and produces large amounts of gasing at the plating surface. This gassing serves to agitate the surrounding plating bath to supply the gold necessary for the plating and also acts as a final cleanser for the surface of the copper being plated. The wire or board is left in this bath only long enough to assure the adherence of an overall coating of gold on the copper. A strike bath containing gold cyanide, modified with citrates is used. Such a bath is commercially avilable from Sel-Rex Corporation under the trade name Aurobond TN.

As illustrated in FIG. 2, the third step of the bonding method is plating a thick accumulation layer of gold over the strike layer on the members to be bonded. In plating the thick accumulation layer on the board, a plating current of 2–6 ASF is maintained to provide a good, smooth, dead-soft accumulation layer of gold. At current levels below the preferred range it has been found that even though the gold deposited is smooth and soft, reliable ultrasonic bonds are not consistently produced. This lower limit is best determined experimentally and may be a feature of the particular system used. At plating currents above the upper limit, the gold plating becomes coarse and porous and does not provide good bondability because it becomes hard, brittle and impure. The upper limit depends upon the makeup of gold plating bath, the concentration of gold in the bath and the form of agitation used to provide a supply of fresh platable gold at the surface of the circuit board. Increasing the agitation or the gold content of the bath as well as increased temperature tends to raise the upper current limit. Therefore, the upper current limit is best determined experimentally for the system being used. The accumulation plating of the wire is similar to the accumulation plating of the board except that a wider current range from 2 to 15 ASF may be used. The higher upper current results from the increased efficiency of the agitation resulting from the shape and small diameter of the wire which eliminates the problem of laminar liquid layers at the plating surface. When the board or wire is removed from the accumulation gold plating bath it is rinsed with tap water and then with distilled water. The steps of applying the accumulation layer of gold is completed by air drying the finished plated members. The gold plating bath is preferably near neutral with a pH between five and six, rather than highly acid, in order to reduce the porosity and increase the purity. The accumulation gold plating bath is, of course, a highly efficient plating bath which produces as little gassing as possible at the plating surface. The use of an inefficient bath which gasses at the plating surface may produce porous accumulation layers of poor quality because of entrapment of gasses. For purposes of this invention an efficient plating bath is one where a very high percentage of the plating current results in plated gold and there is very little gassing. A modified citrate gold cyanide plating bath is preferred. Such baths are commercially available under the trade names Pura Gold 125 by Sel-Rex, ACR 24K Neutral by American Chemical and Refining Company and Orotemp 24 by Technic, Inc.

To obtain the best results, it is important that great care be exercised throughout the cleaning and plating steps to prevent contamination of the plating baths by foreign materials, particularly metals, since the hardness of gold is increased very rapidly by the introduction of very small quantities of contaminating metals. For good plating adhesion, it is preferred that the members-to-be-bonded *not be allowed to dry* between the beginning of the cleaning step and the end of the accumulation plating step, but rather that the member proceed directly from one step to the next.

It is important that the plated gold be as soft as possible because soft ductile gold plating leads to wire ranges of acceptable bonding parameters for the subsequent bonding steps, thus providing a feasible manufacturing process. The quality of the bonds depends more on the softness of the gold on the board than on the wire. Although slight hardness of the gold on the wire reduces the range of acceptable bonding parameters, it has less effect than hardness of the gold on the board.

Figure 3A:
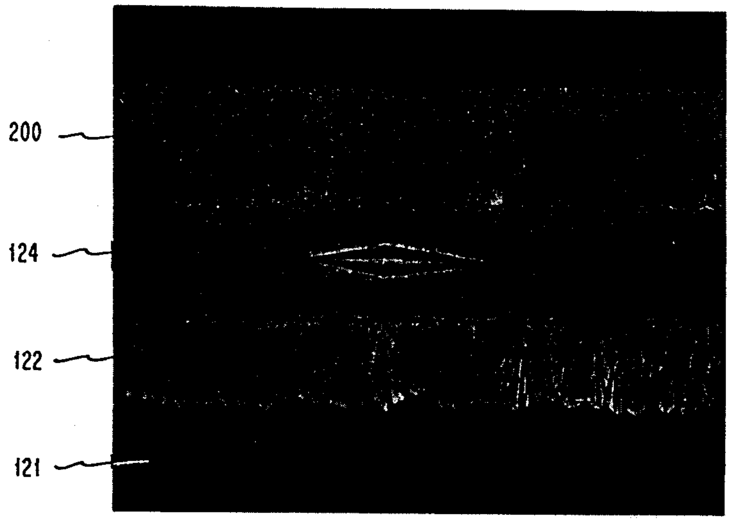
FIGS. 3*a* and 3*b* are micro photographs showing a copper clad printed circuit board having good gold plating in accordance with the method of this invention and for comparison, a circuit board having a poor gold plating not in accordance with this invention.
Figure 3B:
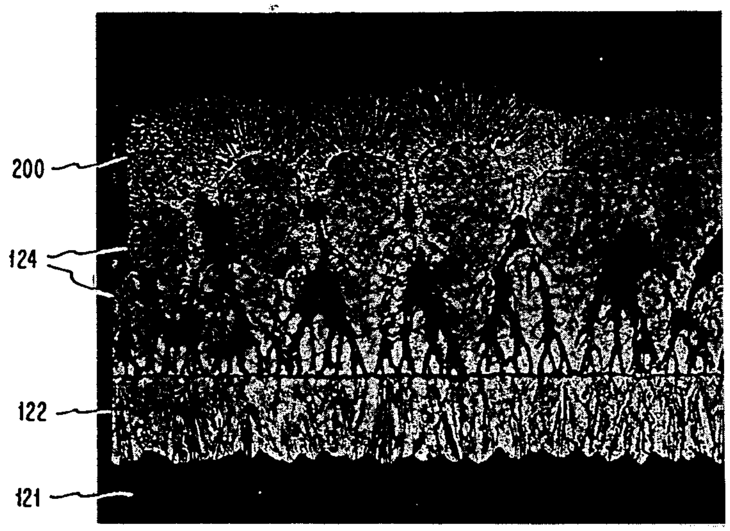

Good gold plating on a circuit board in accordance with this invention is shown in the microphotograph of FIG. 3*a*. The gold 124 has no structural variations visible at 500 times enlargement. The board substrate 121 with copper cladding 122 thereon was plated at a current density of 3 amperes per square foot of plating area. For sectioning purposes the gold was overplated with a layer of copper 200 to prevent damage to the gold layer. For comparison, unacceptable gold plating on a circuit board is shown in the microphotograph of FIG. 3*b*. This gold plating 124 has a porous and columnar structure. This structure produces very poor ultrasonic bonds because of gold hardness brittleness and impurity. It is to be noted that this unacceptable plating resulted from plating current of 6 ASF because the plating current varied. A change to a constant current gave good plating at 6 ASF, but at 7 ASF a porous structure like that in the photograph again resulted.

The plating current limits for good ultrasonic bonding should be experimentally determined for the gold plating system being used since they depend on the bath and the amount of agitation. Once the current range has been determined, it is preferable to set the plating current in the middle of the range to assure production of consistently bondable gold deposits.

Figure 4A:
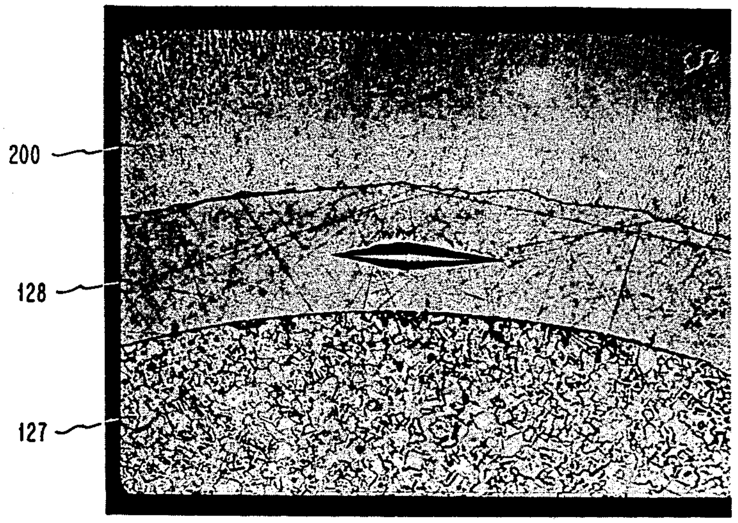
FIGS. 4*a*, 4*b*, 4*c* and 4*d* are micro photographs of gold layers on copper wire showing a progression from good gold plating in accordance with this invention to poor plating, not in accordance with this invention.
Figure 4B:
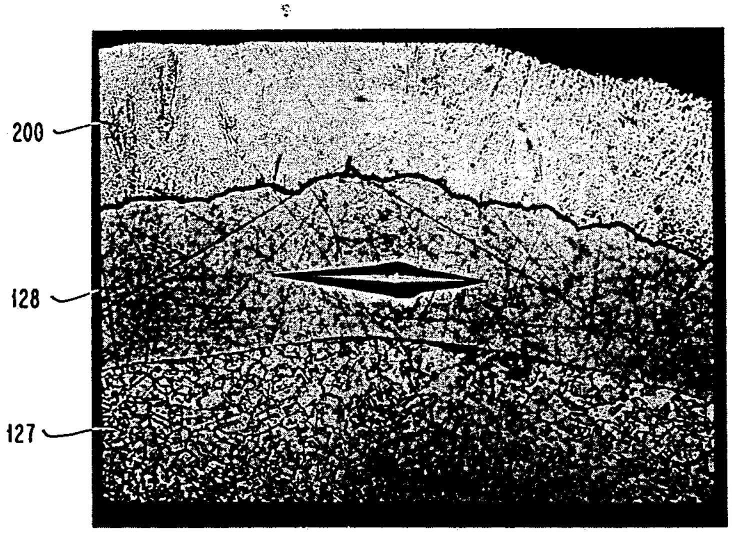
Figure 4C:
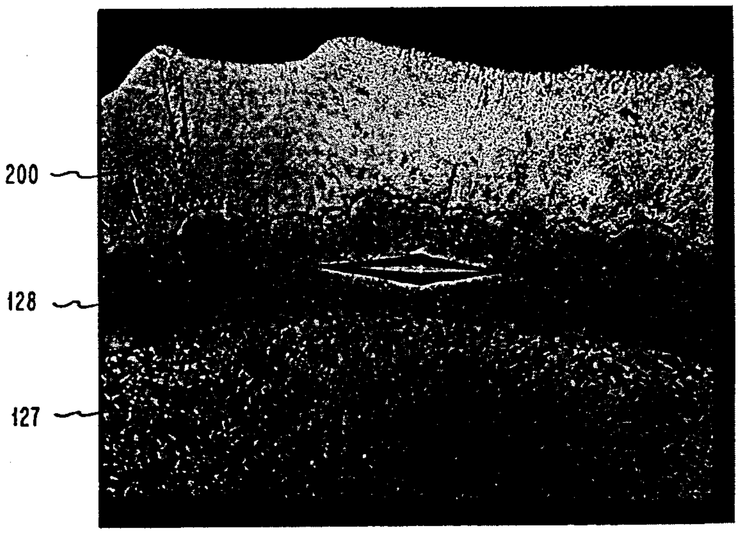
Figure 4D:
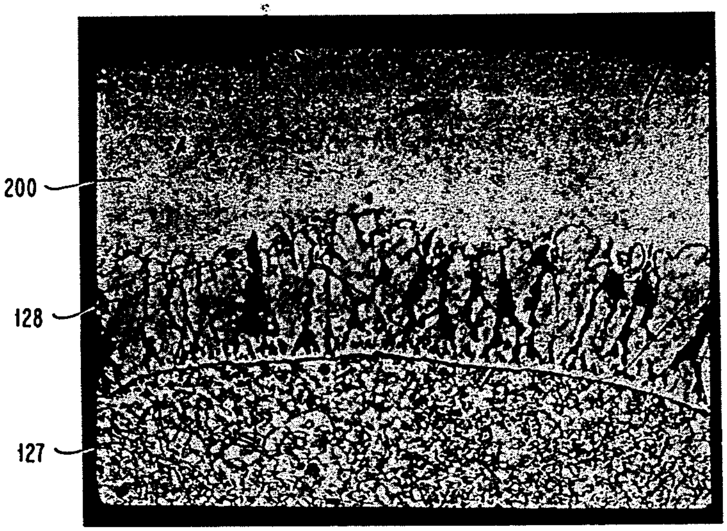

FIGS. 4*a*, 4*b*, 4*c* and 4*d* contain 500X microphotographs of gold layers 128 deposited on copper wire 127. As with the microsections of the plated boards, the gold has been overplated with copper 200 to prevent deformation of the gold layer during sectioning. FIG. 4*a* is of a wire having a layer of smooth, dead-soft gold. This gold was plated at a current density of 6 ASF. FIG. 4*b* is of a wire plated at 12 ASF and begins to show a rough surface on the gold layer. The wire in FIG. 4*c* was plated at 15 ASF and shows increased roughness of the gold surface. The wire in FIG. 4*d* was plated at a current density of 21 ASF and shows a definite columnar porous structure which is not suitable for ultrasonic bonding, since it is impure, hard and brittle.

Now returning to the processing steps, the final step of the process is bonding the gold coated members together. The members may be bonded immediately after they are dried at the end of the plating step or they may be set aside for an indefinite period prior to bonding. When the plated wire 126 is to be bonded to the plated board 120, the board 120 is mounted in an ultrasonic bonding apparatus such as shown in FIG. 1. As illustrated in FIG. 2, Step 4a, the wire 126 is placed where it is to be bonded and the bonding tip 110 is positioned on the wire so that the clamping force supplied by spring 112 holds the wire in contact with the board. As illustrated in Step 4*b*, the ultrasonic bonder's excitation coil 104 is then energized by excitation oscillator 102. This vibrates the wire 126 in a longitudinal direction at a high frequency such as 60,000 Hz. The vibration and clamping force combine to cause the gold layer 128 on the wire to merge into gold layer 124 on the board to form a uniform layer without a discernible bond line separating the layers. Because of the low power used to form the bonds, it is thought that the temperature of the gold is not raised sufficiently to create a hot weld. It is therefore thought that the ultrasonic bonding creates a cold weld between the two clean gold surfaces.

Figure 5A:
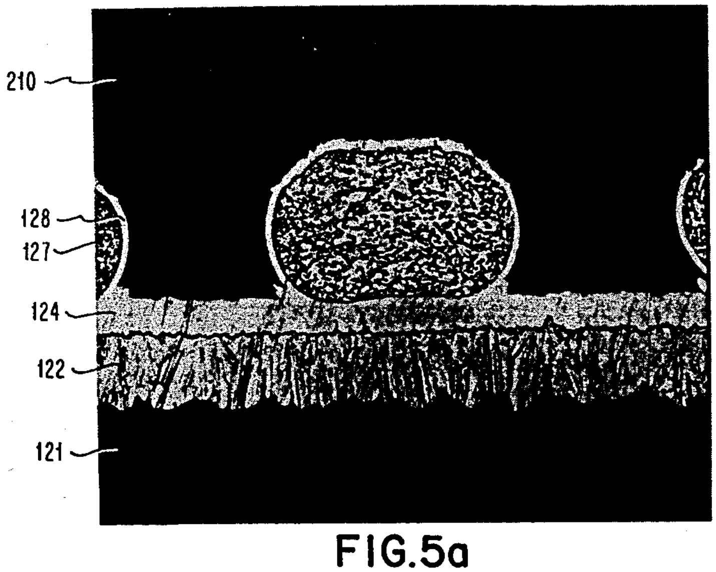
FIGS. 5*a*, 5*b*, 5*c* and 5*d* are micro photographs showing some of the effects of different bonding powers and wire hardnesses on the quality of the ultrasonic bonds of the present invention.
Figure 5B:
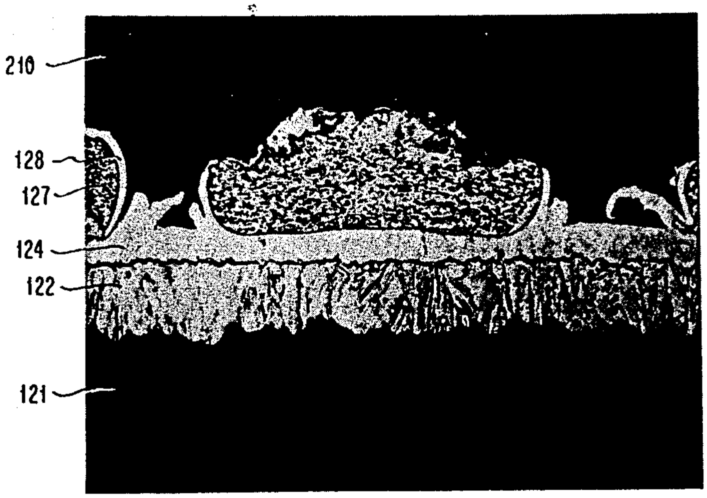
Figure 5C:
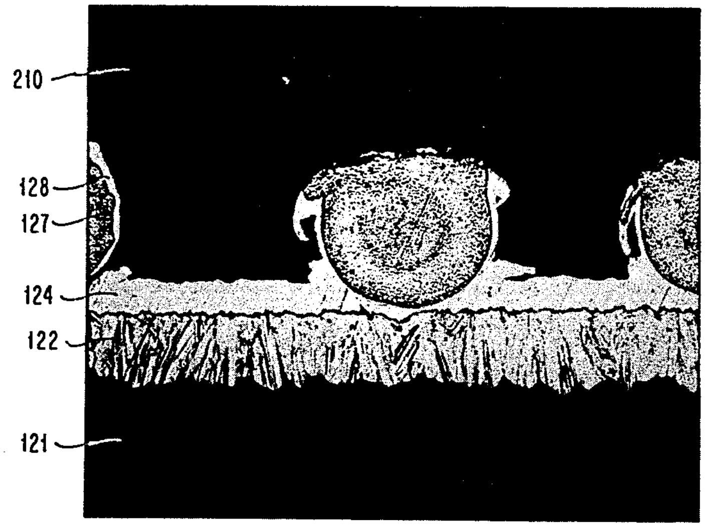
Figure 5D:
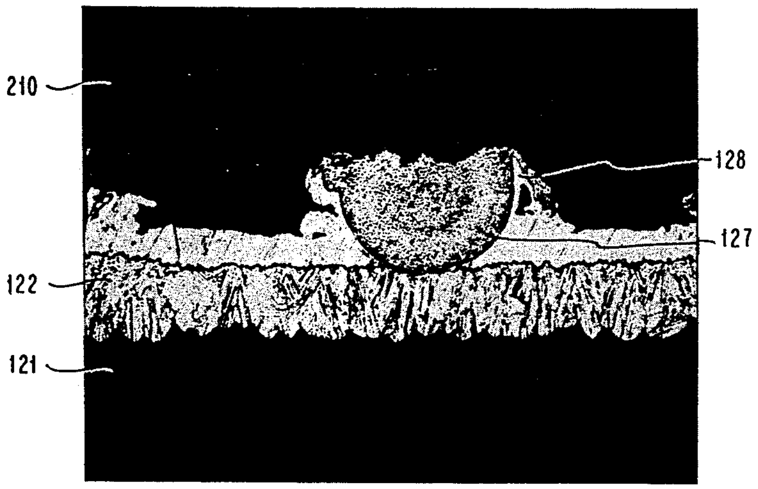

The amplitude of the ultrasonic vibration of the wire, the clamping force, the duration of the vibration and the ductility of the wire are important parameters in obtaining quality ultrasonic bonds. The use of the spring 112 to provide the clamping force makes the clamping force repeatable from bond to bond without adding significantly to the driven mass and thus without overloading transducer 106. Stabilization of the clamping force in this manner results in a wide range of vibration amplitude and duration which produce good quality bonds. The clamping force is not critical and a value in the range of 130–160 grams has been found quite satisfactory although values outside that range are also adequate. FIGS. 5a, 5b, 5c and 5d contain microphotographs at 500X of wires bonded to a printed circuit board using a clamping force of 130 grams. In FIGS. 5*a* and 5*b*, fully annealed, gold plated oxygen-free, high conductivity (OFHC) copper wire was ultrasonically bonded to a gold plated copper clad circuit board. This OFHC copper wire is quite ductile and therefore can be deformed during bonding without destroying the quality of the plating when appropriate power levels are used. FIGS. 5*c* and 5*d* are of gold plated hardened copper wire which was ultrasonically bonded to a gold plated copper clad circuit board. This copper wire was dispersion hardened with beryllium oxide and is not easily deformed. The boards with bonded wires shown in these photographs were potted in potting compound 210 and then sectioned using well known procedures in order to protect the wires during sectioning.

It is to be noted that the electrical power input to the excitation coil 104 during bonding determines the bonding power and is proportional to the bonding tip displacement.

FIG. 5*a* shows a gold plated oxygen-free, high conductivity (OFHC) copper wire bonded to a board using a bonding tip vibration displacement of 94 microinches and a duration of 1.05 seconds. This is a good bond because there is no discernible boundary between the merged layers of gold, and the wire has not been unduly deformed and is still entirely gold plated, thus protecting it from corrosion.

FIG. 5*b* is of a similar OFHC wire bonded using a bonding tip displacement of 158 microinches for 1.05 seconds. As can be readily seen, this is an unsatisfactory bond due to the excessive deformation of the wire and the removal of the gold plate from the upper surface of the wire. This is an example of the poor bonds which are created by the use of excessive power during ultrasonic bonding.

FIG. 5*c* is a gold plated, hardened, copper wire which was bonded using a 94 microinch displacement for 1.05 seconds as were the bonding parameters for the OFHC wire of FIG. 5*a*. As can be seen from the microphotograph, this wire has been eroded by the bonding action with a consequent removal of the gold layer and exposure to corrosion. It will be also noted that the copper clad layer directly under the wire has been deformed. This wire is overbonded and not satisfactory.

The fourth photograph is of the hardened wire bonded with a bonding tip displacement of 158 microinches for a time of 1.05 seconds as were the bonding parameters for the OFHC wires of FIG. 5*b*. In this bond, the erosion of the wire is more severe, the gold has been extruded from between the copper on the board and the wire at the point of contact and the copper cladding on the board is severely bowed.

As can be seen from a comparison of the photographs in FIGS. 5*a*, 5*b*, 5*c* and 5*d*, the use of ductile wire produces better results and is less likely to result in major damage in the event that the wire is overbonded.

Bond quality was determined by pull tests on the wires after bonding to the circuit boards. The direction of pull in these tests was perpendicular to the surface of the printed circuit boards to assure uniformity of testing conditions. The tests were run with 2.5, 3.5 and 4.0 mil OFHC fully annealed copper wire. Fully annealed wire is used because of its ductility and to prevent thermal exposure in insulation stripping from partially annealing the copper and changing the wire's characteristics in some places. The table in FIG. 6 shows the results of these tests using laminated circuit boards. Results are shown for three different thicknesses of the copper cladding on the circuit board. The second entry for each thickness is the diameter of the wires which was bonded to the board while the third entry is the unbonded pull strength of that wire. The strength of these wires is sufficient to prevent breakage if normal care is used in handling the bonded wires while the conductivity is sufficient for many uses. Each copper-clad thickness had five wires bonded for a bonding time of 0.57 seconds at each of five input powers and five wires bonded for 2.8 seconds at each of the same five input powers. The input powers were 81, 91, 100, 106 and 112 microinches bonding tip displacement. The entry in the table for each of these times and powers is the average for the five bonds of the ratio of the pull strength of the bonds to the tensile strength of the unbonded wire expressed as a percentage. An entry of Fail in the table signifies significant wire damage. A good bond for most applications is one with pull strength in excess of 100 grams, except for the 2.5 mil wire where a bond is defined as good if it has a pull strength of at least 80 grams, since the wire's unbonded pull strength is only 93 grams. The wide range of bonding times and the power inputs which result in good bonds indicate a feasible manufacturing process. All of the bonds recorded in the table in FIG. 6 were made with a clamping force of 160 grams. Other bonds made with a clamping force of 130 grams also produced good results. The boards had a nominal 300 microinches of gold plated thereon and the wire was plated with a nominal 100 microinches of gold.

Failures can result from the separation of the cladding from the expoxy substrate. The metal-expoxy interfacial failures are believed to result from movement of the copper cladding during the ultrasonic bonding weakening the lamination of the copper to the epoxy. Experience has shown that the larger the diameter of the wire, the thicker the copper cladding on the circuit board must be to avoid interfacial failure.

The gold layer on the boards for which data is presented in the table does not need to be as thick as 300 microinches to produce good bonds, however, the 300 microinch gold layer facilitates subsequent reworking of the bonds. If it is desired to remove a wire because it has become broken or because of engineering changes, the wire is displaced 2 or 3 mils sideways to shear the bond. The thickness of the gold on the board assures the continued coverage of the copper cladding on the board by gold and presents a surface suitable for bonding the replacement wire to the same location. The reworking of wire because they are broken or because of engineering changes is made possible by the wires being exposed. The wires can be exposed because they are strong enough that they don't need to be potted for strength and because the gold plating provides protection from environmental conditions, thus alleviating the necessity of potting the wires for environmental protection. Accelerated aging tests and exposure tests on bonded wires produced no statistically significant change in pull strength of the bonds.

As can be seen from the table, the quality of the bond produced depends not only on the diameter of the wire but also on the thickness of the copper on the laminated printed circuit board and on the strength of the lamination.

The bonds formed by this process are much stronger than the dead-soft gold of which they are formed. Good bonds in accordance with the invention give pull strengths two to five times as strong as would be expected on the basis of the tensile strength of dead-soft gold, which is about 18,000 psi. A 2.5 mil wire, having a bonded area of approximately 0.000005 square inches which can withstand 0.2 lbs (90 grams) of pull demonstrates a strength in the order of 40,000 psi. As the bonding area increases to 0.000012 square inches with a 4 mil wire, strengths equaling the 0.5 lb pull strength of the wire were obtained. Such tests demonstrate that the strength of the gold to gold ultrasonic bond exceeded 100,000 psi in some instances. As a matter of fact, it was not the gold to gold ultrasonic bond which generally failed, but rather, either the wire itself or the copper-board interface. It is thought that this unexpected increase in strength may result from the pressure of the harder cubic structure metal on which the gold is deposited and from the thinness of the gold coatings, however, the mechanism which causes the unexpectedly strong bonds is not fully understood. The benefits resulting from the unexpected increase in strength are manifest in the strong bonds produced in accordance with this invention and by the wide range of bonding parameters which yield consistently reliable bonds.

My method also works well when bonding to materials other than copper such as nickel and permalloy.

While the invention has been described in terms of a preferred embodiment, it will be understood by those skilled in the art that many variations may be made in the described method and types of articles with which it is used, without departing from the spirit and scope of the invention.

I claim:

1. A method of connecting terminals on a copper-clad printed circuit board comprising the steps of:
   - gold plating the terminals of said circuit board with a layer of deadsoft, smooth gold;
   - gold plating a copper wire with a layer of dead-soft, smooth;
   - placing in contact with the gold-plated terminal the gold-plated copper wire;
   - applying pressure to the wire against the board to maintain a gold-to-gold contact;
   - ultrasonically vibrating the wire relative to the the board until a gold-to-gold bond is formed between the wire and the board thereby making an electrical connection.

2. The method of claim 1 wherein the plating steps are performed in a neutral bath to provide maximum gold density and purity.

3. The method of claim 1 wherein each plating step comprises:
   - cleaning the members to remove adhesion-impairing and contaminating materials;
   - plating a gold strike coating onto the member in a gold strike plating bath; and
   - plating gold accumulation layer on the member over the gold strike coating in an efficient plating bath.

4. The method of claim 3 wherein the plating of the accumulation layer on the circuit board is performed with a plating current of between 2 and 6 amperes per square foot of the area to be plated.

5. The method of claim 3 wherein the plating of the accumulation layer on the wire is performed with a plating current of between 2 and 15 amperes per square foot of the area to be plated.

6. The method of claim 5 wherein the copper wire is made of fully annealed oxygen-free, high conductivity copper.

* * * * *